United States Patent
Zhan et al.

(10) Patent No.: US 8,873,213 B2
(45) Date of Patent: Oct. 28, 2014

(54) HIGH VOLTAGE SWING DECOMPOSITION METHOD AND APPARATUS

(75) Inventors: Hao-Jie Zhan, Hsinchu (TW); Tsung-Hsin Yu, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 218 days.

(21) Appl. No.: 13/420,072

(22) Filed: Mar. 14, 2012

(65) Prior Publication Data

US 2013/0241615 A1   Sep. 19, 2013

(51) Int. Cl.
   *H02H 3/22*   (2006.01)
   *H03K 5/08*   (2006.01)

(52) U.S. Cl.
   USPC .......................................... 361/111; 327/309

(58) Field of Classification Search
   USPC ................................ 361/42, 56, 111; 327/309
   See application file for complete search history.

(56) References Cited

U.S. PATENT DOCUMENTS

| | | | | |
|---|---|---|---|---|
| 5,574,395 A | * | 11/1996 | Kusakabe | 327/309 |
| 5,910,725 A | * | 6/1999 | Gist | 323/313 |
| 6,075,686 A | * | 6/2000 | Ker | 361/56 |
| 7,087,968 B1 | * | 8/2006 | Lai et al. | 257/355 |
| 7,245,467 B2 | * | 7/2007 | Yeh et al. | 361/56 |
| 7,642,258 B2 | * | 1/2010 | Chang et al. | 514/249 |
| 7,643,258 B2 | * | 1/2010 | Lai et al. | 361/56 |
| 7,777,998 B2 | * | 8/2010 | Stockinger et al. | 361/56 |
| 8,040,647 B2 | * | 10/2011 | Logiudice | 361/84 |
| 8,742,803 B2 | * | 6/2014 | Schuler | 327/112 |

* cited by examiner

*Primary Examiner* — Jared Fureman
*Assistant Examiner* — Angela Brooks
(74) *Attorney, Agent, or Firm* — Duane Morris LLP

(57) ABSTRACT

A voltage swing decomposition circuit includes first and second clamp circuits and a protection circuit. The first clamp circuit is configured to clamp an output node of the first clamp circuit at a first voltage level when an input node of the voltage swing decomposition circuit has a voltage higher than the first voltage level. The second clamp circuit is configured to clamp an output node of the second clamp circuit at a second voltage level, higher than the first level, when the voltage of the input node is lower than the second voltage level. The protection circuit is coupled to the output nodes of the first and second clamp circuits, and is configured to selectively set an output node of the protection circuit to the first or second voltage level. The first and second clamp circuits are coupled together by the output node of the protection circuit.

20 Claims, 10 Drawing Sheets

US 8,873,213 B2

HIGH VOLTAGE SWING DECOMPOSITION METHOD AND APPARATUS

BACKGROUND

In various circuit applications, the voltage of a signal is used to represent or convey information. Typically, a digital signal has a voltage at a first level when the signal represents a first state, and the signal has a voltage at a second level corresponding to a second state. For example, a voltage such as 0 V (or another relatively "low" voltage) is often chosen as a ground or reference voltage to represent a logical 'low' value or state, and a positive voltage such as 5 V is often chosen as a power supply voltage to represent a logical 'high' value or state. The specific voltage levels used, and thus the voltage swing, are often design considerations that are based on a variety of factors, including hardware constraints, resource consumption requirements, and manufacturing or processing constraints.

In some situations, a signal that has a relatively large difference between low and high voltage values is difficult to process with components that are not designed to handle such high voltage swing or that cannot sustain such high-voltage stressing over time. For example, digital circuit components in an integrated circuit often have a relatively low safe operating voltage due to the use of single gate oxide devices. A high voltage signal (e.g., 5 V digital input signal) can cause damage if it is used with digital circuitry that that has a lower safe operating voltage (e.g., 2.8 V).

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Embodiments of the present disclosure provide voltage protection for a variety of applications involving high voltage signals. A high voltage signal is decomposed into several different signals that have lower voltage swing than the high voltage signal. Advantageously, a voltage signal having high voltage swing $V_{swing\_high}$ can be decomposed to signals having lower (less) swing than $V_{swing\_high}$ without using special voltage protection circuitry that itself has voltage swing $V_{swing\_high}$. Additionally, no DC current is consumed by various embodiments.

Figure 1:
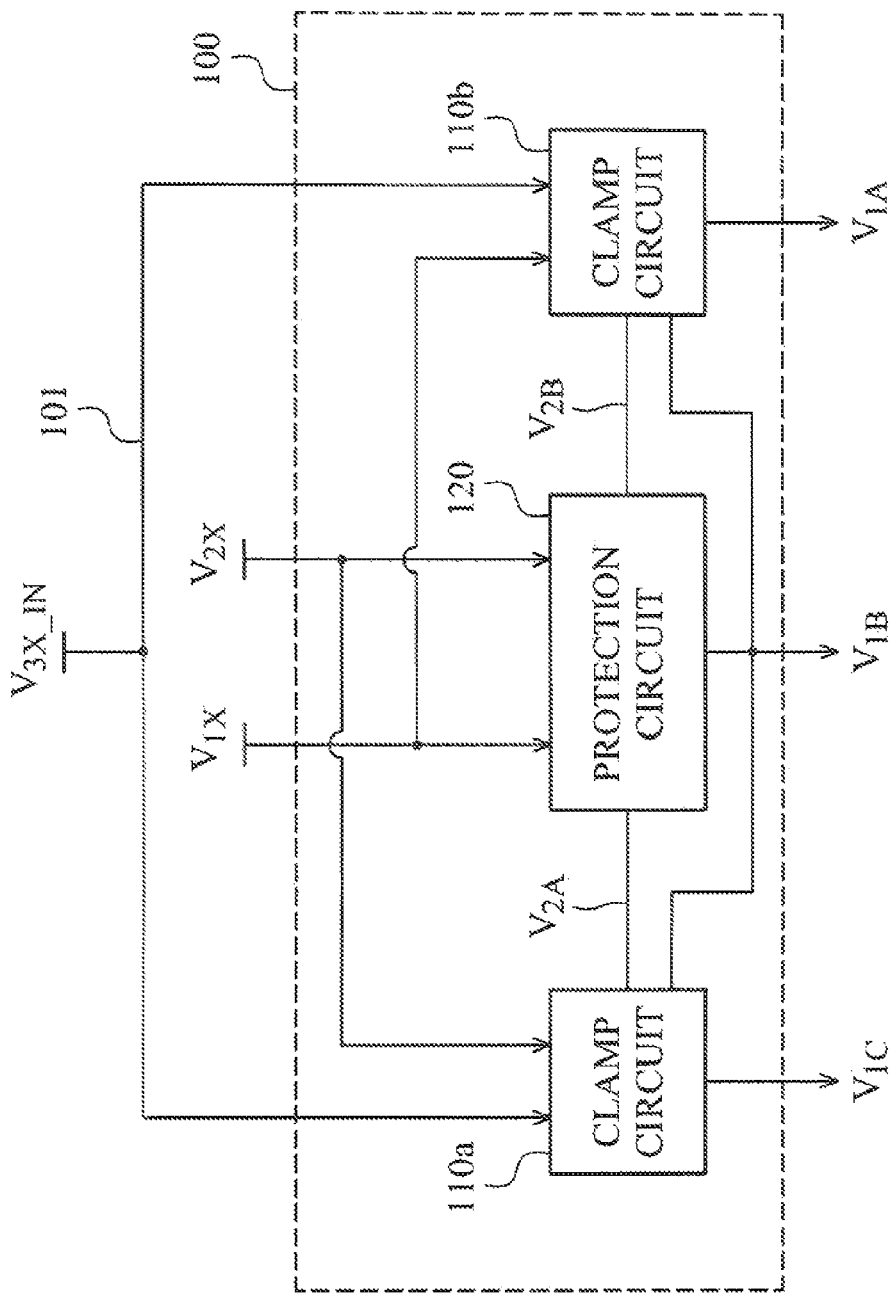
FIG. 1 is a block diagram of a voltage swing decomposition circuit in accordance with some embodiments of the present disclosure.

FIG. 1 is a block diagram of a voltage swing decomposition circuit in accordance with some embodiments of the present disclosure. Voltage swing decomposition circuit 100 (also referred to as a voltage level decomposition circuit) receives an input with a relatively high voltage swing and generates signals with relatively lower voltage swings. For example, in some embodiments, an input signal (denoted $V_{3X\_IN}$ in FIG. 1) at an input node 101 varies between 0 V and 3 V, corresponding to a 3 V swing. In the following discussion, a 3 V input swing is used as an example, but embodiments of the present disclosure are applicable to input signals and output signals having various voltages and voltage swings. The label "$V_{3X\_IN}$" denotes a signal having three times the voltage swing relative to a voltage $V_{1X}$. In some embodiments, $V_{1X}$ and $V_{2X}$ are 1 V and 2 V, respectively. Other values can be used as well. Circuit 100 decomposes the high voltage swing input signal into signals $V_{1A}$, $V_{1B}$, $V_{1C}$, $V_{2A}$, and $V_{2B}$. To perform the voltage swing decomposition, voltages $V_{1X}$ and $V_{2X}$ having respective values of 1 V and 2 V are supplied to circuit 100.

Circuit 100 includes clamp circuits 110a and 110b and a protection circuit 120. Clamp circuit 110a provides signal $V_{1C}$, which is clamped at $V_{2X}$ when $V_{3X\_IN}$ is lower than $V_{2X}$. Due to the clamping, $V_{1C}$ varies between 2 V and 3 V as $V_{3X\_IN}$ varies between 0 V and 3 V. Clamp circuit 110b provides signal $V_{1A}$, which is clamped at $V_{1X}$ when $V_{3X\_IN}$ is higher than $V_{1X}$. Due to the clamping, $V_{1A}$ varies between 0 V and 1 V as $V_{3X\_IN}$ varies between 0 V and 3 V. $V_{1A}$ and $V_{1C}$ are generated based on $V_{2A}$ and $V_{2B}$, which vary from 0 V to 2 V and from 1 V to 3 V, respectively, as $V_{3X\_IN}$ varies between 0 V and 3 V. Based on $V_{2A}$ and $V_{2B}$, protection circuit 120 generates signal $V_{1B}$, which varies from 1 V to 2 V as $V_{3X\_IN}$ varies from 0 V and 3 V. Thus, protection circuit 120 is configured to selectively set an output node, which couples clamp circuits 110a and 110b together, to either 1 V or 2 V.

Figure 2A:
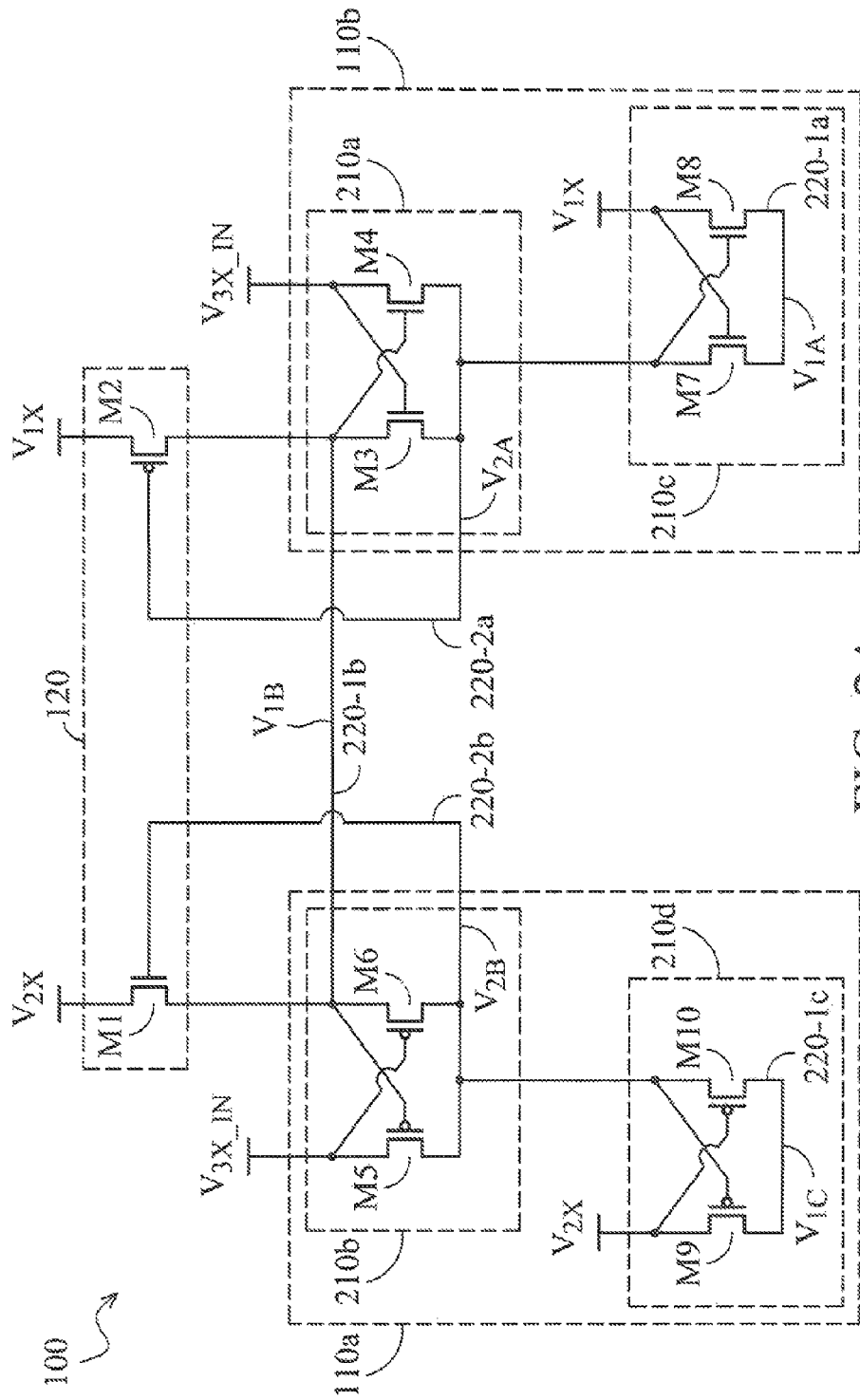
FIG. 2A is a schematic diagram of an implementation of circuit 100 using latches for the clamp circuits.

FIG. 2A is a schematic diagram of an implementation of circuit 100 using latches for the clamp circuits. Clamp circuit 110a includes latches 210b and 210d, and clamp circuit 110b includes latches 210a and 210c. Each latch has a pair of transistors coupled as shown in FIG. 2A. Clamp circuits 110a and 110b have PMOS and NMOS transistors, respectively, in their latches. In each latch, the corresponding pair of transistors is configured so that exactly one of the transistors in the pair is in the "on" state (conducting current) at a time. The latches function as voltage comparators to compare which MOS transistor has a stronger driving strength. Each latch has a pair of transistors that are coupled at respective source/drain terminals. For each latch having NMOS transistors, the transistor in the latch that is turned on is the transistor having a higher gate voltage (relative to source voltage) than the gate voltage of the other transistor in the corresponding pair. For each latch having PMOS transistors, the transistor in the latch that is turned on is the transistor having a lower gate voltage (relative to source voltage) than the gate voltage of the other transistor in the corresponding pair.

Protection circuit 120 includes a pair of protection switches. In some embodiments, the switches include an NMOS transistor M1 and a PMOS transistor M2 coupled as shown by a node 220-1*b* having voltage $V_{1B}$. Transistor M2, which is controlled by the voltage at node 220-2*a* (i.e., by voltage $V_{2A}$), is configured to selectively set node 220-1*b* to $V_{1X}$. Transistor M1, which is controlled by the voltage at node 220-2*b* (i.e., by voltage $V_{2B}$), is configured to selectively set node 220-1*b* to $V_{2X}$. Node 220-1*b* is an output node of protection circuit 120, node 220-2*a* is an output node of latch 210*a*, node 220-2*b* is an output node of latch 210*b*, node 220-1*a* is an output node of latch 210*c*, and node 220-1*c* is an output node of latch 210*d*. Nodes 220-1*a* and 220-1*c* are also referred to as output nodes of clamp circuits 110*b* and 110*a*, respectively.

Figure 2B:
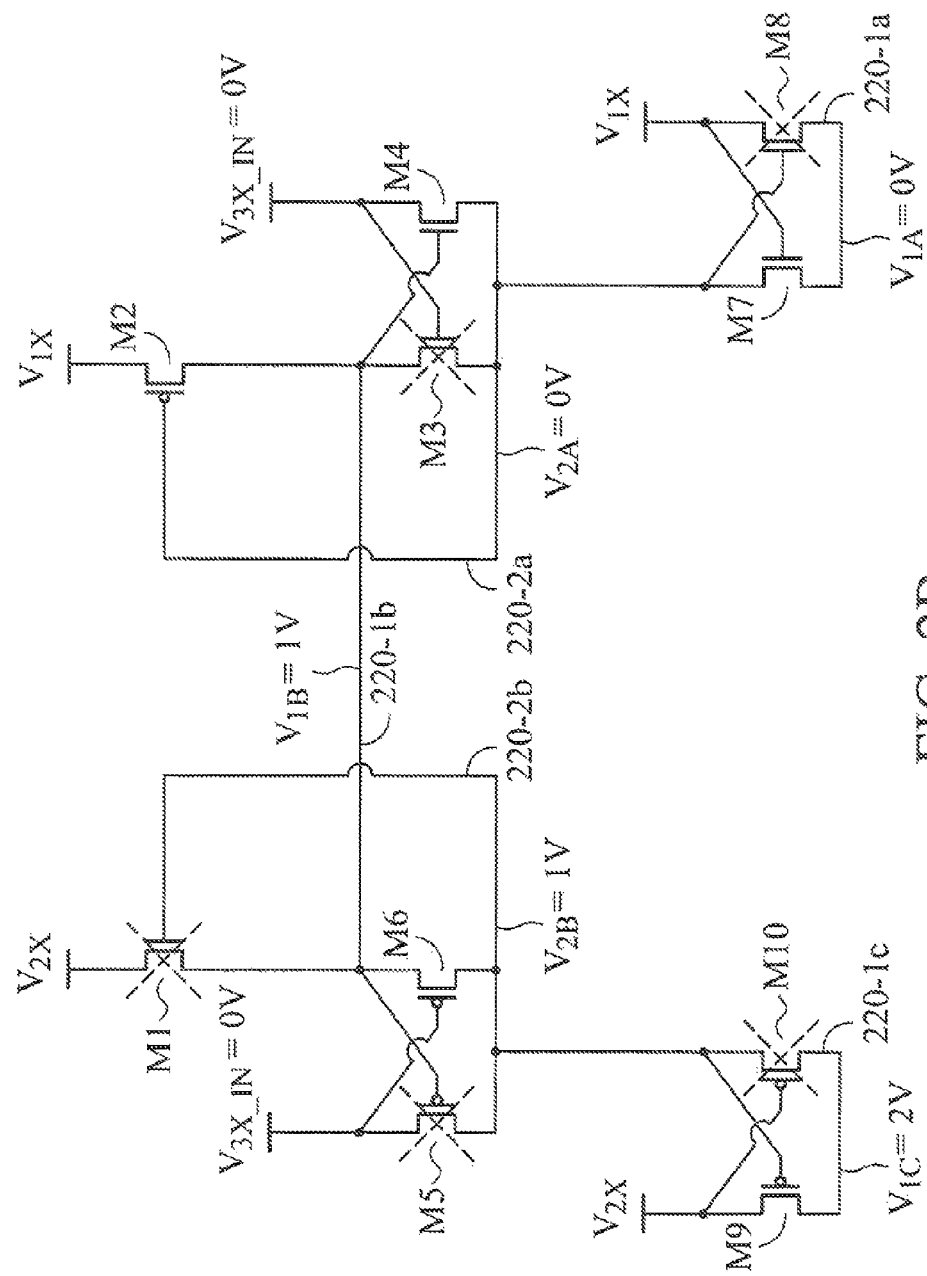
FIG. 2B is a schematic diagram of an implementation of circuit 100 for the case corresponding to $V_{3X\_IN}=0$ V.
Figure 2C:
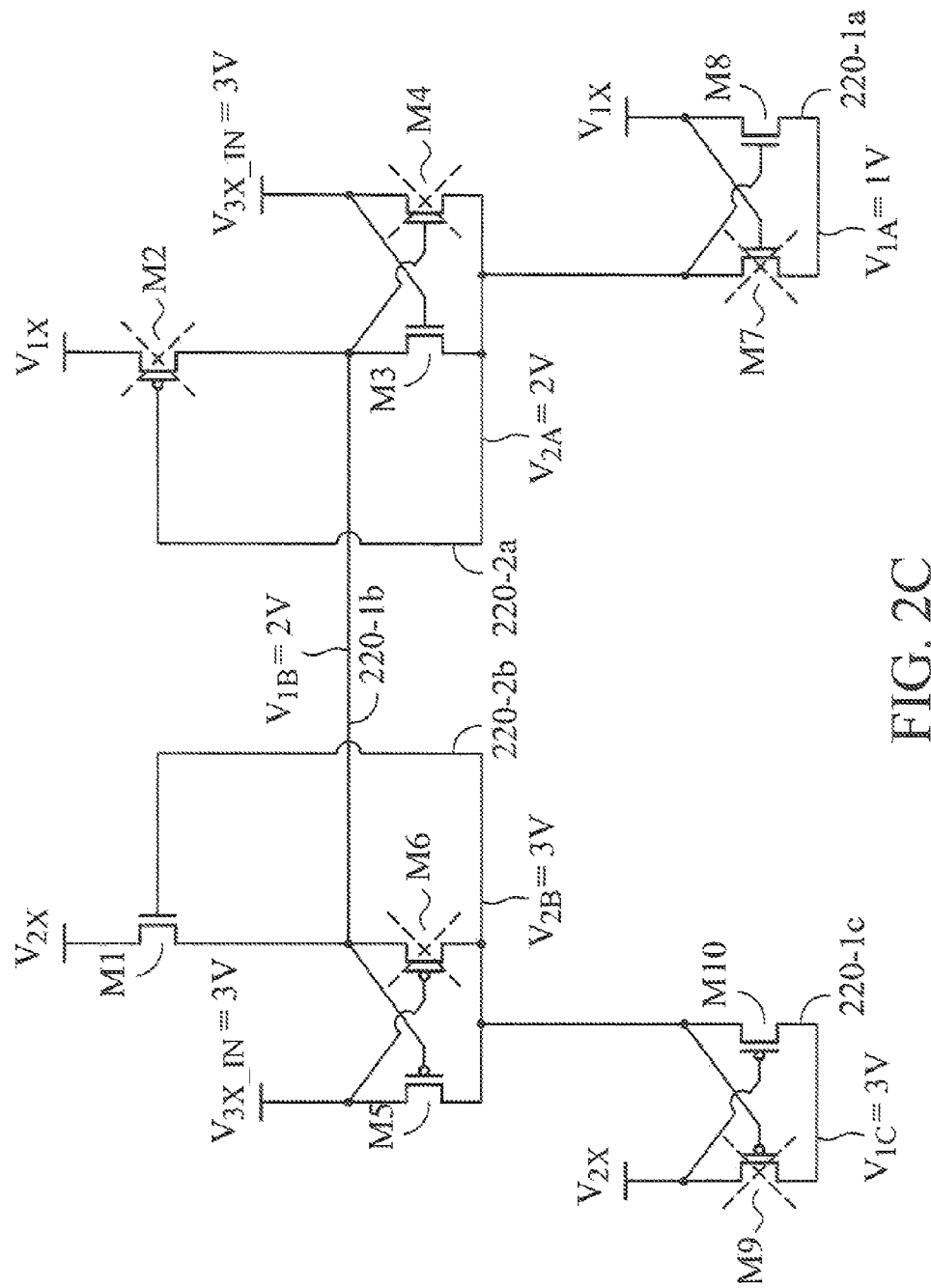
FIG. 2C is a schematic diagram of an implementation of circuit 100 for the case corresponding to $V_{3X\_IN}=3$ V.

The operation of circuit 100 can be understood with reference to FIGS. 2B-2C. In FIGS. 2B-2C, transistors that are turned off are shown with a dashed 'X'. FIG. 2B illustrates the case of $V_{3X\_IN}$ having its minimum voltage value (0 V in this example). Because the gate of transistor M3 is biased by $V_{3X\_IN}=0$ V, transistor M3 has a lower gate voltage than transistor M4, so transistor M3 is turned off and transistor M4 is turned on. One of ordinary skill will understand that metal oxide semiconductor field effect transistors (MOSFETs) are typically built symmetrically from source to drain, and source/drain terminals of a MOSFET are contextually labeled as either source or drain terminals according to the following convention when the transistor is biased. The source/drain terminal of an NMOS transistor having a relatively low potential is called a source terminal, and the other source/drain terminal is called a drain terminal. The source/drain terminal of a PMOS transistor having a relatively high potential is called a source terminal, and the other source/drain terminal is called a drain terminal.

Node 220-2*a* (corresponding to signal $V_{2A}$) is pulled down to 0 V by transistor M4 because $V_{3X\_IN}=0$ V. PMOS transistor M2 is turned on by the gate voltage of 0 V and maintains node 220-1*b* (corresponding to signal $V_{1B}$) at 1 V. Because the gate voltages of PMOS transistors M5 and M6 are 1 V and 0 V, respectively, transistor M5 is turned off and transistor M6 is turned on. Thus, the voltage at node 220-2*b* (signal $V_{2B}$) is 1 V.

Transistors M1 and M2 have respective terminals coupled by node 220-1*b*. The source-to-gate voltage for PMOS transistor M2 is 1 V, and the gate-to-source voltage for NMOS transistor M1 is 0 V. Thus, transistor M1 is turned off.

Because the gate voltages of transistors NMOS M7 and M8 are 1 V and 0 V, respectively, transistor M7 is turned on and transistor M8 is turned off. Node 220-1*a* (corresponding to signal $V_{1A}$) is pulled down to 0 V.

Because the gate voltages of PMOS transistors M9 and M10 are 1 V and 2 V, respectively, transistor M9 is turned on and transistor M10 is turned off. Thus, the voltage at node 220-1*c* (signal $V_{1C}$) is 2 V.

FIG. 2C illustrates the case of $V_{3X\_IN}$ having its maximum voltage value (3 V in this example). PMOS transistor M6, which is biased by a 3 V gate, is turned off, and transistor M5 is turned on, pulling the voltage at node 220-2*b* (signal $V_{2B}$) high to 3 V. NMOS transistor M1 that is biased by 3 V is turned on, maintaining the voltage at node 220-1*b* (signal $V_{1B}$) at 2 V.

Because the gate voltages of NMOS transistors M3 and M4 are 3 V and 2 V, respectively, transistor M3 is turned on and transistor M4 is turned off. Thus, the voltage at node 220-2*a* (signal $V_{2A}$) is 2 V.

The gate-to-source voltage for NMOS transistor M1 is 1 V, and the source-to-gate voltage for PMOS transistor M2 is 0 V. Thus, transistor M2 is turned off.

Because the gate voltages of transistors NMOS M7 and M8 are 1 V and 2 V, respectively, transistor M7 is turned off and transistor M8 is turned on. Thus, the voltage at node 220-1*a* (signal $V_{1A}$) is 1 V.

Because the gate voltages of PMOS transistors M9 and M10 are 3 V and 2 V, respectively, transistor M9 is turned off and transistor M10 is turned on. Node 220-1*c* (corresponding to signal $V_{1C}$) is pulled high to 3 V.

Embodiments of the present disclosure provide various control signals. At latch 210*a*, $V_{2A}=V_{3X\_IN}$ while $V_{3X\_IN}<V_{2X}$, and $V_{2A}=V_{2X}$ while $V_{3X\_IN}>V_{2X}$. Latch 210*a* is configured to latch node 220-2*a* at 0 V or $V_{2X}$ based on $V_{3X\_IN}$. At latch 210*b*, $V_{2B}=V_{3X\_IN}$ while $V_{3X\_IN}>V_{1X}$, and $V_{2B}=V_{1X}$ while $V_{3X\_IN}<V_{1X}$. Latch 210 *b* is configured to latch node 220-2*b* at $V_{1X}$ or 3 V based on $V_{3X\_IN}$. At latch 210*c*, $V_{1A}=V_{3X\_IN}$ while $V_{3X\_IN}<V_{1X}$, and $V_{1A}=V_{1X}$ while $V_{3X\_IN}>V_{1X}$. Latch 210*c* is configured to latch node 220-2*c* at 0 V or $V_{1X}$ based on $V_{2A}$. At latch 210*d*, $V_{1C}=V_{3X\_IN}$ while $V_{3X\_IN}>V_{2X}$, and $V_{1C}=V_{2X}$ while $V_{3X\_IN}<V_{2X}$. Latch 210*d* is configured to latch node 220-2*d* at $V_{2X}$ or 3 V based on $V_{2B}$. $V_{1B}=V_{1X}$ while $V_{3X\_IN}<V_{1X}$, and $V_{1B}=V_{3X\_IN}$ while $V_{1X}<V_{3X\_IN}<V_{2X}$, and $V_{1B}=V_{2X}$ while $V_{3X\_IN}>V_{2X}$.

Figure 3:
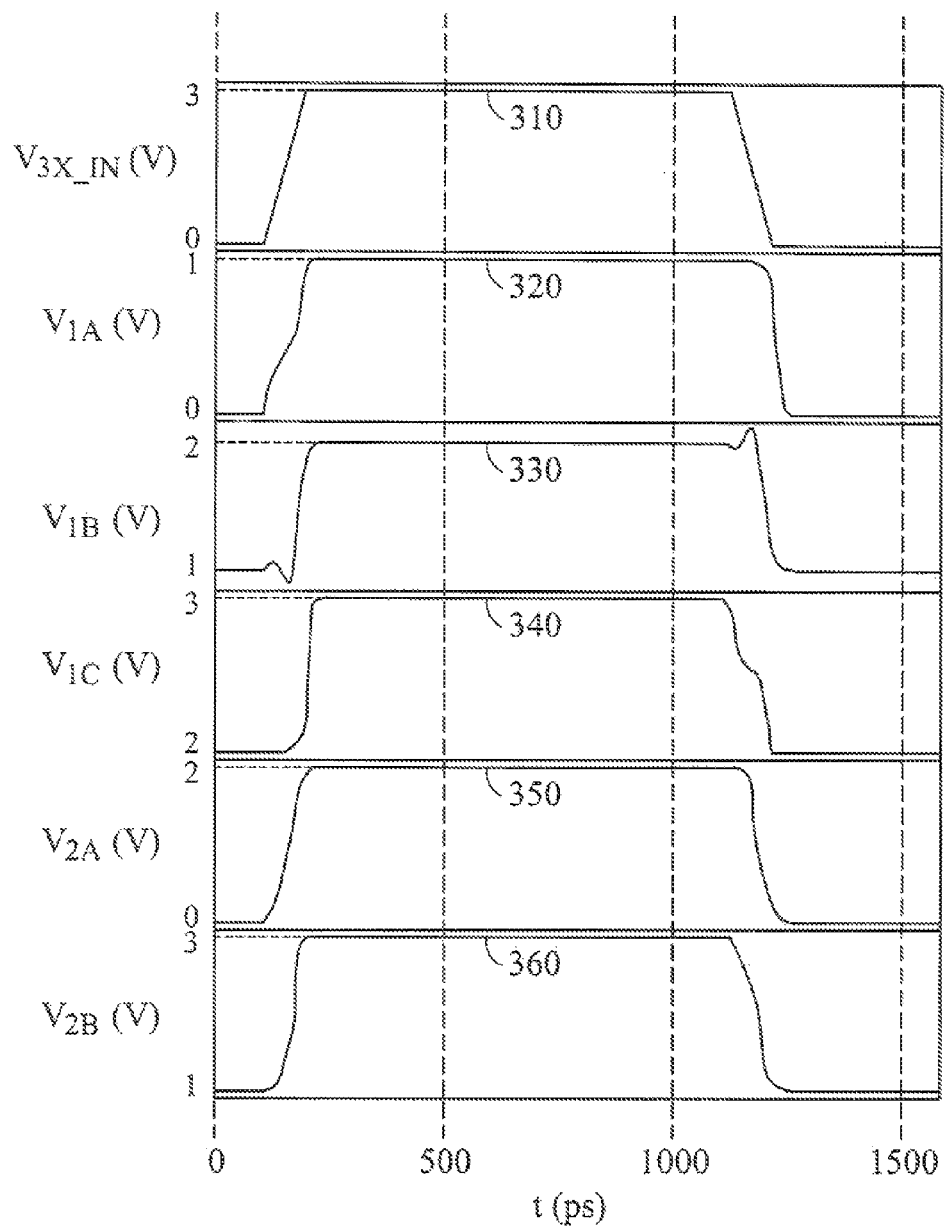
FIG. 3 is a signal trace diagram showing various input and output signals in accordance with some embodiments.

FIG. 3 is a signal trace diagram showing various signals in accordance with some embodiments. At a 1 Gbps data rate in a 28 nm fabrication process, the following signals are plotted in FIG. 3: $V_{3X\_IN}$ (plot 310); $V_{1A}$ (plot 320); $V_{1B}$ (plot 330); $V_{1C}$ (plot 340); $V_{2A}$ (plot 350); and $V_{2B}$ (plot 360). The plots correspond to a 100 fF capacitive load at the respective nodes. Signals $V_{1A}$, $V_{1B}$, and $V_{1C}$ have voltage swings of 1V, and signals $V_{2A}$ and $V_{2B}$ have voltage swings of 2 V. Thus, the input signal $V_{3X\_IN}$ having a high voltage swing of 3 V is processed to generate various control signals having reduced voltage swing. In some embodiments, these control signals are used for overvoltage protection.

Embodiments of the present disclosure are implemented in various fabrication processes, including 25 nm and 28 nm processes. Simulations have yielded successful performance at various process corners, including fast-fast (FF), slow-slow (SS), and typical-typical (TT) corners. One of ordinary skill will understand that these corners refer to carrier mobilities of NMOS and PMOS and devices; for example, FF denotes faster than normal NFETs and faster than normal PFETs. Voltage swing decomposition in accordance with various embodiments may be performed at a wide range of temperatures, including from −40° C. to 125° C.

Figure 4:
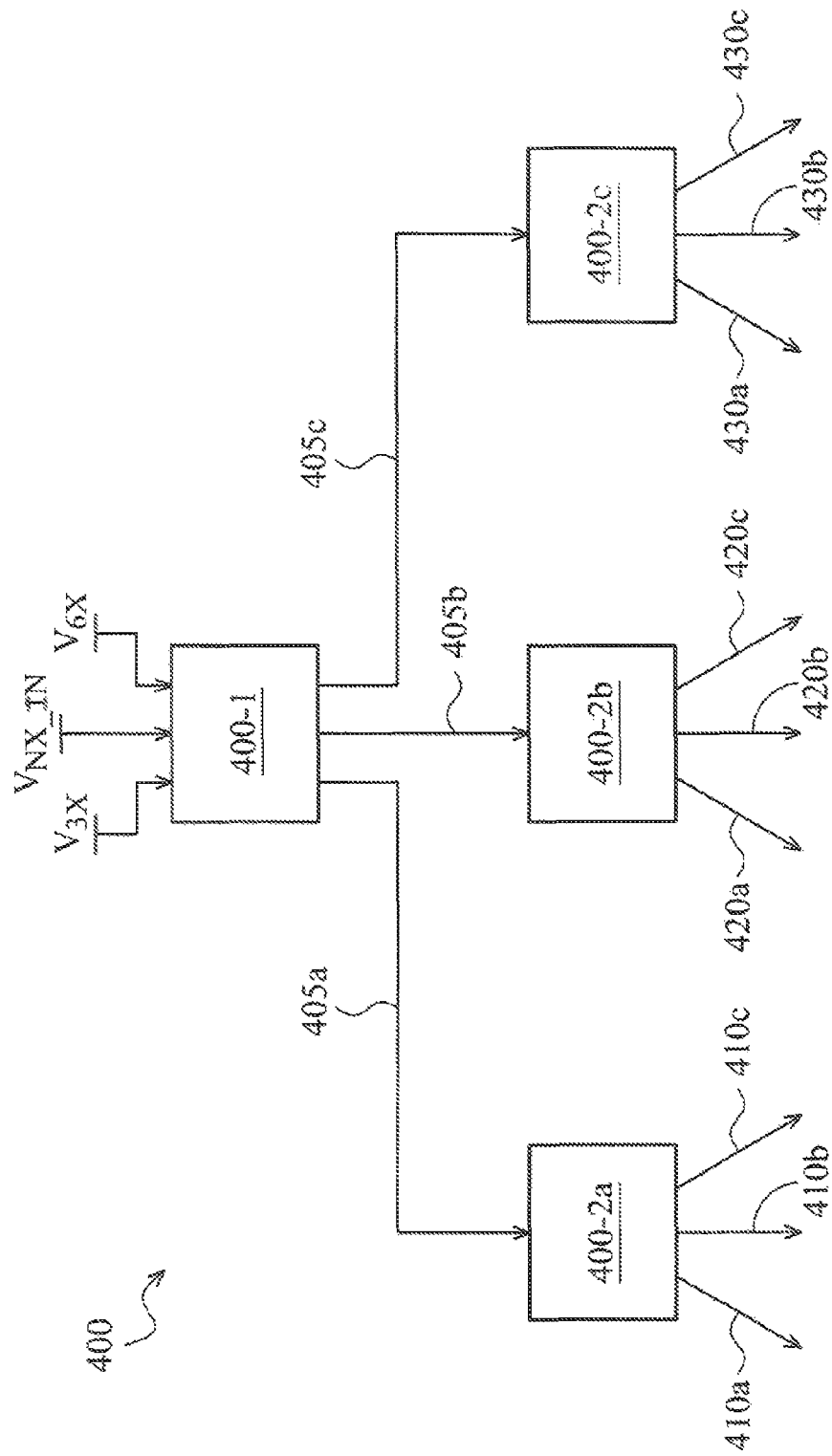
FIG. 4 is a block diagram of a multi-stage voltage swing decomposition circuit in accordance with some embodiments.

In some embodiments, voltage decomposition is performed in multiple stages, e.g., in a tree-based processing topology. FIG. 4 is a block diagram of a multi-stage voltage swing decomposition circuit 400 in accordance with some embodiments. An input voltage signal $V_{NX\_IN}$ having a relatively high voltage swing is decomposed into multiple signals having reduced voltage swing. In one example, $V_{NX\_IN}$ has a low value of 0 V and a high value of 9 V, so it can be referred to as $V_{9X\_IN}$ using similar nomenclature as $V_{3X\_IN}$. Voltage decomposition circuits 400-1, 400-2*a*, 400-2*b*, and 400-2*c* are each similar to circuit 100 except that they use different fixed voltages than $V_{1X}$ and $V_{2X}$ that are provided for circuit 100. For example, circuit 400-1 uses fixed voltages of 3 V and 6 V (denoted $V_{3X}$ and $V_{6X}$, respectively) instead of $V_{1X}$ and $V_{2X}$.

At a first processing stage (corresponding to a root of a tree in the tree-structured topology of FIG. 4), circuit 400-1 decomposes input signal $V_{NX\_IN}$ in a similar manner as described above for circuit 100, to provide signal 405a that swings between 0 V and 3 V, signal 405b that swings between 3 V and 6 V, and signal 405c that swings between 6 V and 9 V. Thus, signals 405a, 405b, and 405c are similar to signals $V_{1A}$, $V_{1B}$, and $V_{1C}$, respectively, except for having wider voltage swings.

At a second processing stage (corresponding to children of a root in the tree-structured topology of FIG. 4), each of signals 405a, 405b, and 405c is further processed to yield reduced voltage swing via decomposition circuits 100-2a, 100-2b, and 100-2c, respectively. Circuit 400-2a generates signals 410a, 410b, and 410c. Signal 410a swings between 0 V and 1 V, signal 410b swings between 1 V and 2 V, and signal 410c swings between 2 V and 3 V. Similarly, circuits 400-2b and 400-2c generate signals 420a, 420b, 420c, 430a, 430b, and 430c as shown that have respective voltage swings between the following ranges: 3 V and 4 V; 4 V and 5 V; 5 V and 6 V; 6 V and 7 V; 7 V and 8 V; and 8 V and 9 V. Various numbers of processing stages are used in various embodiments. Although the tree-structured topology of circuit 400 provides voltage swing decomposition for each of signals 405a, 405b, and 405c that are outputs of the first stage, in some embodiments not all of these signals undergo further processing at the second stage.

Thus, in this example, circuit 400-2a includes clamp circuits similar to clamp circuits of circuit 100 but connected to different fixed voltages. The clamp circuits of circuit 400-2a are configured to respectively clamp signal 410a at 1 V when signal 405a is higher than 1 V, and clamp signal 410c at 2 V when signal 405a is lower than 2 V. Similarly, in this example, circuit 400-2b includes clamp circuits configured to respectively clamp signal 420a at 4 V when signal 405b is higher than 4 V, and clamp signal 420c at 5 V when signal 405b is lower than 5 V. Similarly, circuit 400-2c includes clamp circuits configured to respectively clamp signal 430a at 7 V when signal 405c is higher than 7 V, and clamp signal 430c at 8 V when signal 405c is lower than 8 V. Similar to circuit 400-1 at the first stage in the tree, circuits 400-2a, 400-2b, and 400-2c at the second stage each include two latches in each of two clamp circuits. The second stage clamp circuits and latches are not shown in FIG. 4 for graphical convenience; in some embodiments they are arranged similarly as clamp circuits and latches in FIG. 2, except that they are connected to different fixed voltages than analogous components in FIG. 2.

Figure 5:
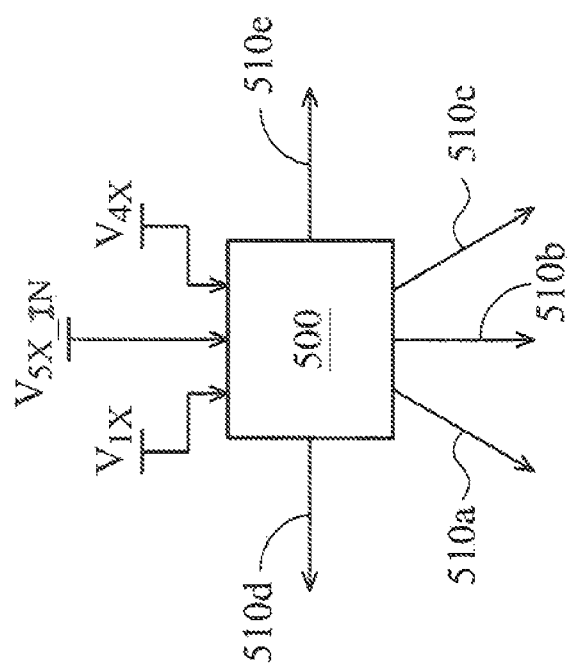
FIG. 5 is a block diagram of a voltage swing decomposition circuit in accordance with some embodiments.

In some embodiments, the control signals outputted by a decomposition circuit have voltage swings of different widths. FIG. 5 is a block diagram of a voltage swing decomposition circuit 500 that is similar to circuit 100 except that circuit 500 does not process an input signal to yield output signals having voltage swings of equal widths. Input signal $V_{5X\_IN}$ has a low value of 0 V and a high value of 5 V. Instead of $V_{2X}$ providing a fixed voltage of 2 V for circuit 100, a fixed voltage of 4 V (denoted $V_{4X}$ in this example) is provided to circuit 500. Circuit 500 generates signal 510a that swings between 0 and 1 V; signal 510b that swings between 1 V and 4 V; and signal 510c that swings between 4 V and 5 V. Signals 510a, 510b, and 510c are similar to signals $V_{1A}$, $V_{1B}$, and $V_{1C}$ in terms of how they are generated, but they have different voltage swings. Additionally, circuit 500 generates a signal 510d that varies between 0 V and 4 V, and a signal 510e that varies between 1 V and 5 V. Thus, signals 510d and 510e are similar to signals $V_{2A}$ and $V_{2B}$ except for having wider (higher) swings. In various embodiments, the input signal that is provided to a voltage decomposition circuit has various voltage swings, including various low and high values. In some embodiments using a multi-stage processing configuration similar to FIG. 4, some voltage decomposition circuits provide output signals having equal voltage swings, and other decomposition circuits provide output signals having unequal swings. Thus, various embodiments provide flexible architectures for decomposing a high voltage swing signal, to accommodate various circuit applications and constraints.

Figure 6:
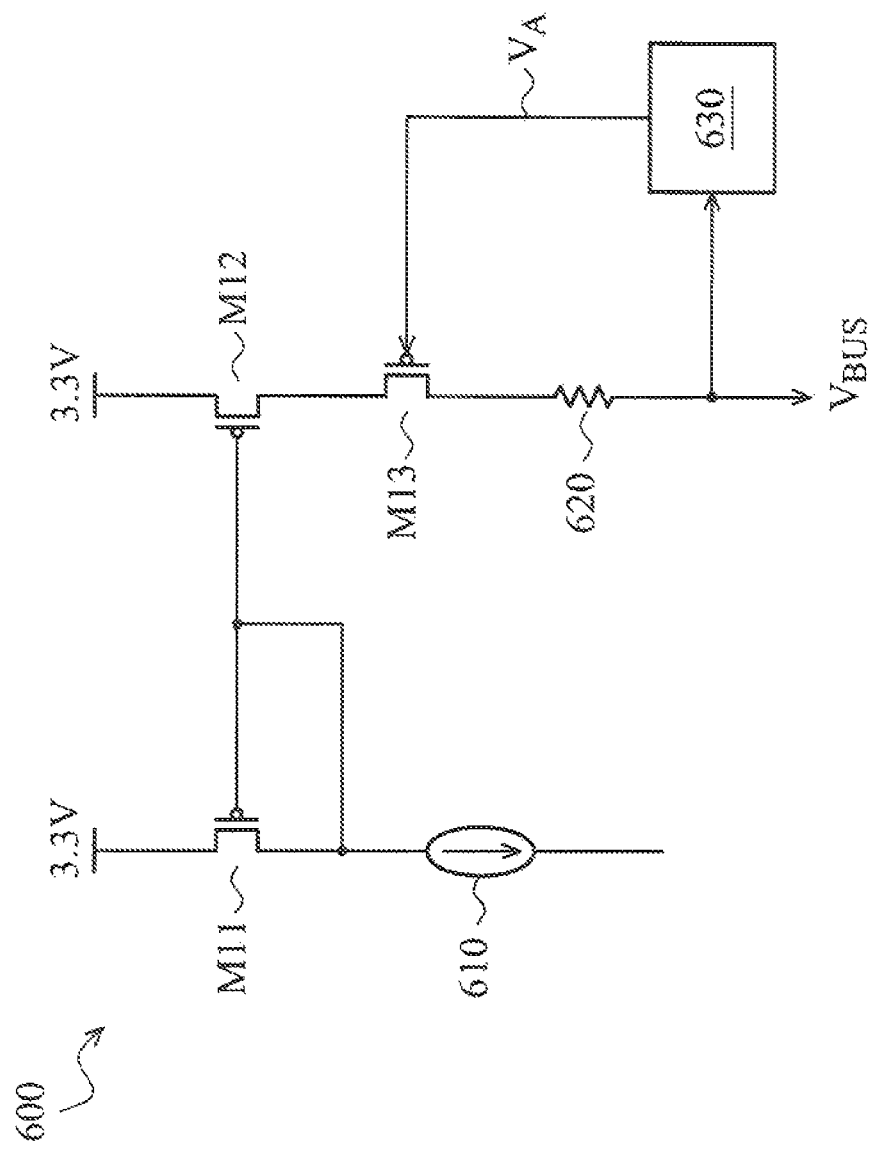
FIG. 6 is a circuit diagram of an example circuit employing voltage swing decomposition in accordance with some embodiments.

FIG. 6 is a circuit diagram of a circuit 600 employing voltage swing decomposition in accordance with some embodiments. Circuit 600 includes transistors M11, M12, and M13; current source 610; resistor 620; and voltage swing decomposition circuit 630. Circuit 630 is similar to circuit 100 except that circuit 630 uses fixed voltages of 1.8 V and 3.3 V instead of 1 V and 2 V that are provided by $V_{1X}$ and $V_{2X}$, respectively, of circuit 100. Signal $V_{BUS}$ swings between 0 V and 5 V. Signal $V_A$ is similar to signal $V_{2B}$ of circuit 100, except that $V_A$ swings between 1.8 V and 5 V instead of between 1 V and 3 V, because of the fixed voltages 1.8 V and 3.3 V. If $V_{BUS}=0$ V, circuit 630 maintains $V_A$ at 1.8 V. PMOS transistor M13 is turned on in accordance with, for example, a session request protocol for the USB on-the-go (USBOTG) specification. If $V_{BUS}=5$ V, circuit 630 maintains $V_A$ at 5 V, turning off transistor M13. Thus, a 5 V swing is reduced to a smaller swing, which improves reliability in this application.

Figure 7:
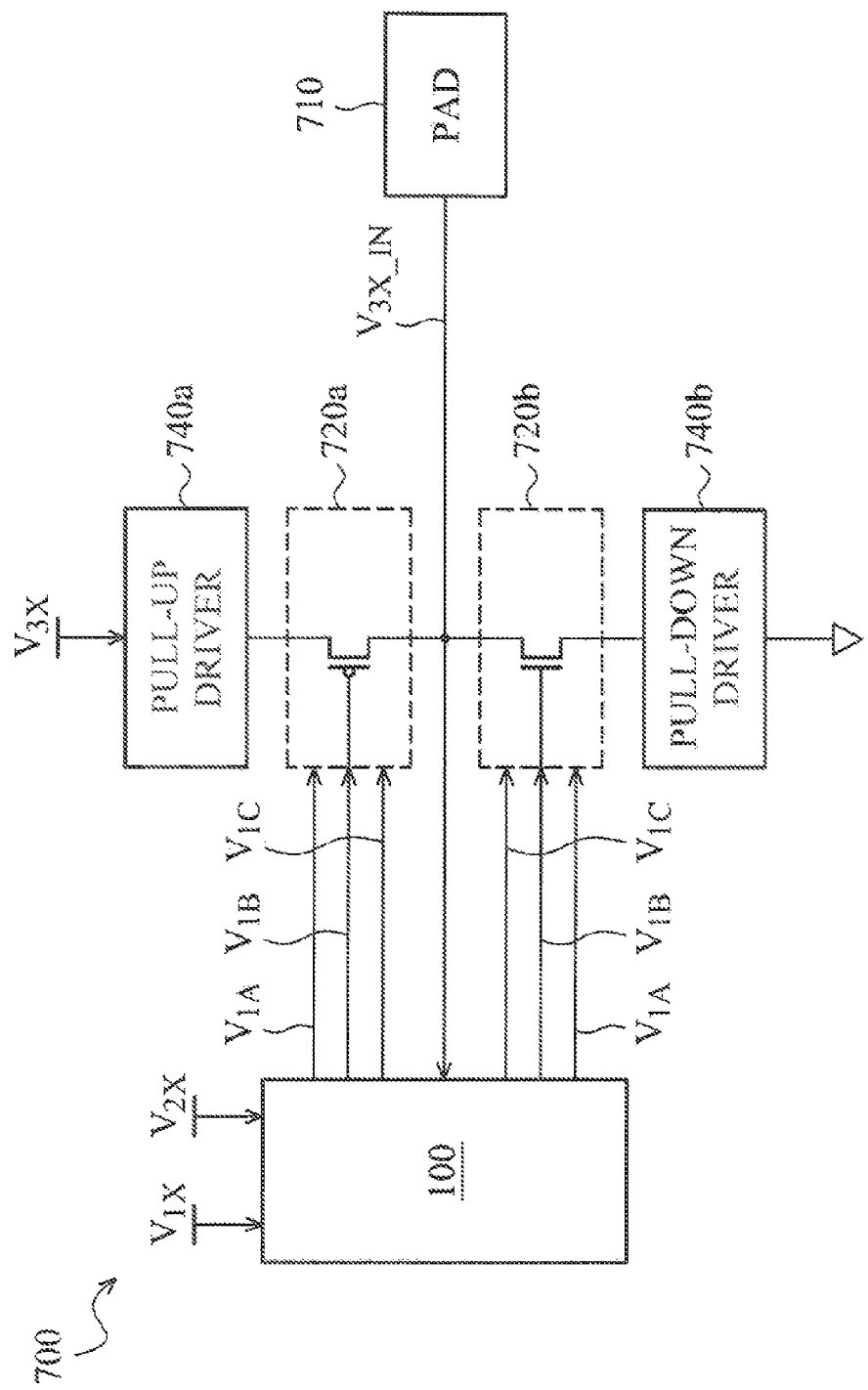
FIG. 7 is a circuit diagram of an example circuit employing voltage swing decomposition in accordance with some embodiments.

FIG. 7 is a circuit diagram of a circuit 700 employing voltage swing decomposition in accordance with some embodiments. An input/output 710 pad 710 has voltage $V_{3X\_IN}$ that varies between 0 and $V_{3X}$. Pad 710 is coupled to circuit 720a, which includes one or more P-type devices (represented collectively by the symbol for a PMOS transistor in FIG. 7), and to circuit 720b, which includes one or more N-type devices (represented collectively by the symbol for an NMOS transistor in FIG. 7). In order to protect circuits 720a and 720b against high voltage swing resulting from pad 710, voltage signal $V_{3X\_IN}$ provided by pad 710 is processed by voltage swing decomposition circuit 100 to yield signals $V_{1A}$, $V_{1B}$, and $V_{1C}$ that have lower swing. In FIG. 7, $V_{3X}=3*V_{1X}$, and $V_{2X}=2*V_{2X}$. Pull-up driver circuit 740a and pull-down driver circuit 740b are conventional driver circuits. Due to control signals $V_{1A}$, $V_{1B}$, and $V_{1C}$, circuits 720a and 720b are protected against high voltage swings, thus ensuring reliability. Advantageously, circuit 700 does not consume DC current.

Figure 8:
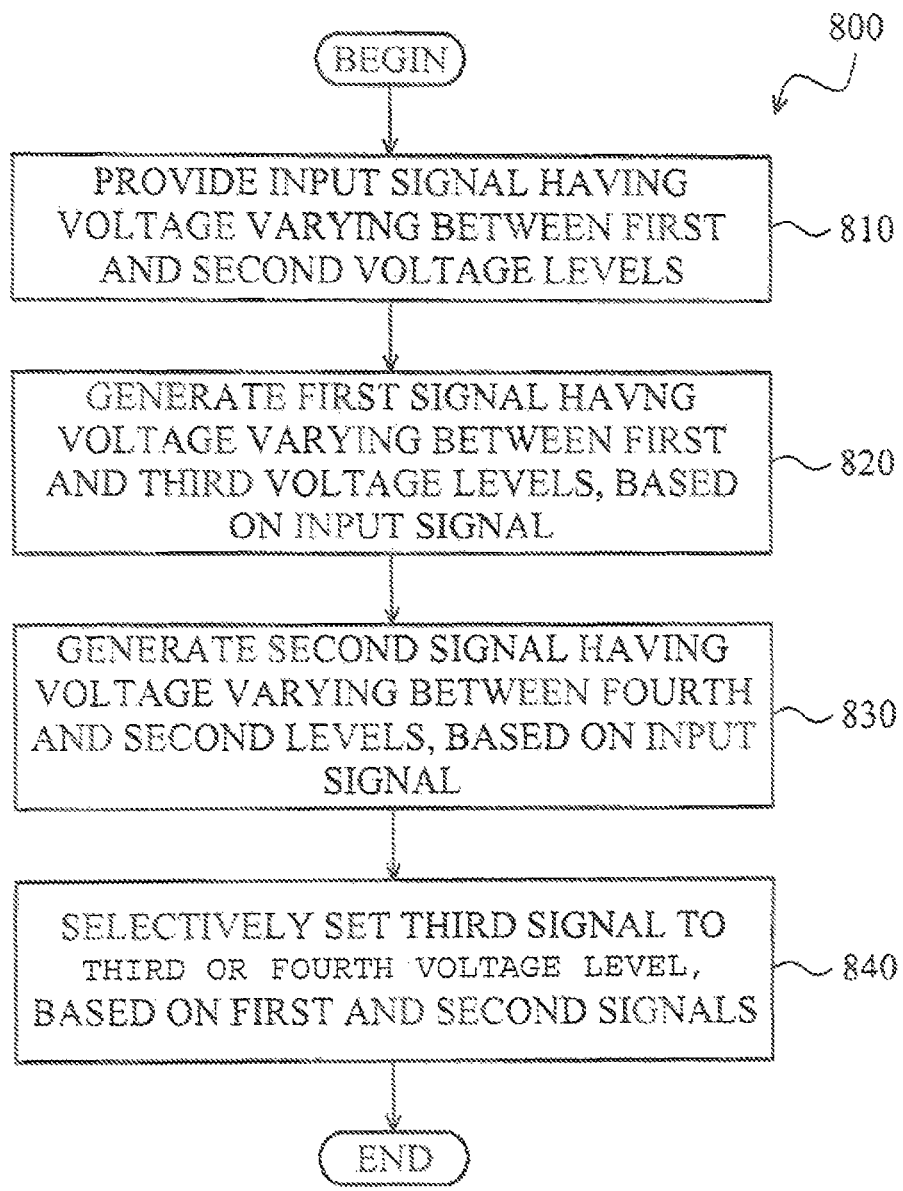
FIG. 8 is a flow diagram of a process in accordance with some embodiments.

FIG. 8 is a flow diagram of a process in accordance with some embodiments. After process 800 begins, an input signal (e.g., $V_{3X\_IN}$) is provided (810), having a voltage varying between a first voltage level (e.g., 0 V) and a second voltage level (e.g., $V_{3X}$). The first voltage level is lower than the second voltage level. A first signal (e.g., $V_{2A}$) having a voltage varying between the first voltage level and a third voltage level (e.g., $V_{2X}$) is generated (820). The third voltage level is higher than the first voltage level and lower than the second voltage level. The first signal is generated based on the input signal. A second signal (e.g., $V_{2B}$) having a voltage varying between a fourth voltage level (e.g., $V_{1X}$) and the second voltage level is generated (830). The fourth voltage level is higher than the first voltage level and lower than the third voltage level. The second signal is generated based on the input signal. A third signal (e.g., $V_{1B}$) is selectively set (840) to one of the third and fourth voltage levels based on the first and second signals. In some embodiments, the process includes generating a fourth signal (e.g., $V_{1A}$) having a voltage varying between the first voltage level and the fourth voltage level. The fourth signal, which is generated based on the first signal, is clamped at the fourth voltage level when the input signal is higher than the fourth voltage level. In some embodiments, the process includes generating a fifth signal (e.g., $V_{1C}$) having a voltage varying between the third voltage level and the second voltage level. The fifth signal, which is generated based on the second signal, is clamped at the third voltage level when the input signal is lower than the third voltage level.

In some embodiments, a voltage swing decomposition circuit (e.g., circuit 100) includes first and second clamp circuits (e.g., clamp circuits 110a and 110b, respectively) and a protection circuit (e.g., protection circuit 120). The first clamp circuit is configured to clamp an output node (e.g., node 220-1a) of the first clamp circuit at a first voltage level (e.g., $V_{1X}$) when an input node of the voltage swing decomposition circuit (e.g., node 101) has a voltage higher than the first voltage level. The second clamp circuit is configured to clamp an output node (e.g., node 220-1c) of the second clamp circuit at a second voltage level (e.g., $V_{2X}$), higher than the first level, when the voltage of the input node is lower than the second voltage level. The protection circuit is coupled to the output nodes of the first and second clamp circuits, and is configured to selectively set an output node (e.g., node 220-1b) of the protection circuit to the first or second voltage level. The first and second clamp circuits are coupled together by the output node of the protection circuit.

In some embodiments, a circuit includes first and second latches (e.g., latches 210a and 210b, respectively) and a protection module (e.g., circuit 120). The first latch includes first and second NMOS transistors (e.g., transistors M3 and M4, respectively). A gate of the first NMOS transistor is coupled to a first terminal of the second NMOS transistor. A gate of the second NMOS transistor is coupled to a first terminal of the first NMOS transistor. A second terminal of the first NMOS transistor is coupled to a second terminal of the second NMOS transistor by an output node (e.g., node 220-2a) of the first latch. The second latch includes first and second PMOS transistors (e.g., transistors M5 and M6, respectively). A gate of the first PMOS transistor is coupled to a first terminal of the second PMOS transistor. A gate of the second PMOS transistor is coupled to a first terminal of the first PMOS transistor. A second terminal of the first PMOS transistor is coupled to a second terminal of the second PMOS transistor by an output node (e.g., node 220-2b) of the second latch. The protection module includes a third NMOS transistor (e.g., transistor M1) and a third PMOS transistor (e.g., transistor M2). A gate of the third PMOS transistor is coupled to the output node of the first latch. A first terminal of the third PMOS transistor is coupled to the first terminal of the first NMOS transistor. A gate of the third NMOS transistor is coupled to the output node of the second latch. A first terminal of the third NMOS transistor is coupled to the first terminal of the second PMOS transistor. The first terminal of the third NMOS transistor is coupled to the first terminal of the third PMOS transistor by an output node (e.g., node 220-1b) of the protection module.

In some embodiments, an input signal (e.g., $V_{3X\_IN}$) is provided, having a voltage varying between a first voltage level (e.g., 0V) and a second voltage level (e.g., $V_{3X}$). The first voltage level is lower than the second voltage level. A first signal (e.g., $V_{2A}$) having a voltage varying between the first voltage level and a third voltage level (e.g., $V_{2X}$) is generated. The third voltage level is higher than the first voltage level and lower than the second voltage level. The first signal is generated based on the input signal. A second signal (e.g., $V_{2B}$) having a voltage varying between a fourth voltage level (e.g., $V_{1X}$) and the second voltage level is generated. The fourth voltage level is higher than the first voltage level and lower than the third voltage level. The second signal is generated based on the input signal. A third signal (e.g., $V_{1B}$) is selectively set to one of the third and fourth voltage levels based on the first and second signals.

Although examples are illustrated and described herein, embodiments are nevertheless not limited to the details shown, since various modifications and structural changes may be made therein by those of ordinary skill within the scope and range of equivalents of the claims.

What is claimed is:

1. A voltage swing decomposition circuit comprising:
   a first clamp circuit configured to clamp a voltage of an output node of said first clamp circuit at a first voltage level when a voltage of an input node of said voltage swing decomposition circuit is higher than the first voltage level;
   a second clamp circuit configured to clamp a voltage of an output node of said second clamp circuit at a second voltage level when the voltage of the input node is lower than the second voltage level, wherein the second voltage level is higher than the first voltage level; and
   a protection circuit coupled to the first and second clamp circuits, said protection circuit configured to selectively set an output node of said protection circuit to one of the first and second voltage levels;
   wherein said first and second clamp circuits are coupled together by the output node of said protection circuit.

2. The voltage swing decomposition circuit of claim 1, wherein said protection circuit includes:
   a first protection switch configured to selectively set the output node of said protection circuit to the first voltage level, said first protection switch controlled by said first clamp circuit; and
   a second protection switch configured to selectively set the output node of said protection circuit to the second voltage level, said second protection switch controlled by said second clamp circuit.

3. The voltage swing decomposition circuit of claim 2, wherein:
   said first protection switch comprises a PMOS transistor including a gate coupled to the output node of said first clamp circuit, a first terminal tied to the first voltage level, and a second terminal coupled to the output node of said protection circuit; and
   said second protection switch comprises an NMOS transistor including a gate coupled to the output node of said second clamp circuit, a first terminal tied to the second voltage level, and a second terminal coupled to the output node of said protection circuit.

4. The voltage swing decomposition circuit of claim 1, wherein:
   said first clamp circuit includes a first latch configured to latch an output node of said first latch at one of a reference voltage level and the second voltage level based on the voltage of the input node, wherein the reference voltage level is lower than the first voltage level; and
   said second clamp circuit includes a second latch configured to latch an output node of said second latch at one of the first voltage level and a third voltage level based on the voltage of the input node, wherein the third voltage level is higher than the second voltage level;
   wherein the voltage of the input node is variable between the reference voltage level and the third voltage level.

5. The voltage swing decomposition circuit of claim 4, wherein:
  said first latch includes a pair of NMOS transistors, wherein a gate of each transistor in said pair of NMOS transistors is coupled to a first terminal of the other transistor in said pair of NMOS transistors, and second terminals of the respective transistors in said pair of NMOS transistors are coupled together by the output node of said first latch; and
  said second latch includes a pair of PMOS transistors, wherein a gate of each transistor in said pair of PMOS transistors is coupled to a first terminal of the other transistor in said pair of PMOS transistors, and second terminals of the respective transistors in said pair of PMOS transistors are coupled together by the output node of said second latch.

6. The voltage swing decomposition circuit of claim 4, wherein:
  said first clamp circuit further includes a third latch coupled to the output node of said first latch, wherein said third latch is configured to latch an output node of said third latch at one of the reference voltage level and the first voltage level based on the voltage of the output node of said first latch; and
  said second clamp circuit further includes a fourth latch coupled to the output node of said second latch, wherein said fourth latch is configured to latch an output node of said fourth latch at one of the second voltage level and the third voltage level based on the voltage of the output node of said second latch.

7. The voltage swing decomposition circuit of claim 6, wherein:
  said third latch includes a pair of NMOS transistors, wherein a gate of each transistor in said pair of NMOS transistors is coupled to a first terminal of the other transistor in said pair of NMOS transistors, and second terminals of the respective transistors in said pair of NMOS transistors are coupled together by the output node of said first clamp circuit; and
  said fourth latch includes a pair of PMOS transistors, wherein a gate of each transistor in said pair of PMOS transistors is coupled to a first terminal of the other transistor in said pair of PMOS transistors, and second terminals of the respective transistors in said pair of PMOS transistors are coupled together by the output node of said second clamp circuit.

8. The voltage swing decomposition circuit of claim 1, further comprising:
  a third clamp circuit configured to clamp a voltage of an output node of said third clamp circuit at a third voltage level when the voltage of the output node of said first clamp circuit is higher than the third voltage level, wherein the third voltage level is lower than the first voltage level; and
  a fourth clamp circuit configured to clamp a voltage of an output node of said fourth clamp circuit at a fourth voltage level when the voltage of the output node of said first clamp circuit is lower than the fourth voltage level, wherein the fourth voltage level is higher than the third voltage level and lower than the first voltage level.

9. The voltage swing decomposition circuit of claim 1, further comprising:
  a third clamp circuit configured to clamp a voltage of an output node of said third clamp circuit at a third voltage level when the voltage of the output node of said second clamp circuit is higher than the third voltage level, wherein the third voltage level is higher than the second voltage level; and
  a fourth clamp circuit configured to clamp a voltage of an output node of said fourth clamp circuit at a fourth voltage level when the voltage of the output node of said second clamp circuit is lower than the fourth voltage level, wherein the fourth voltage level is higher than the third voltage level and higher than the second voltage level.

10. A circuit comprising:
  a first latch including first and second NMOS transistors, wherein a gate of the first NMOS transistor is coupled to a first terminal of the second NMOS transistor, a gate of the second NMOS transistor is coupled to a first terminal of the first NMOS transistor, and a second terminal of the first NMOS transistor is coupled to a second terminal of the second NMOS transistor by an output node of said first latch;
  a second latch including first and second PMOS transistors, wherein a gate of the first PMOS transistor is coupled to a first terminal of the second PMOS transistor, a gate of the second PMOS transistor is coupled to a first terminal of the first PMOS transistor, and a second terminal of the first PMOS transistor is coupled to a second terminal of the second PMOS transistor by an output node of said second latch; and
  a protection module including a third NMOS transistor and a third PMOS transistor, wherein a gate of the third PMOS transistor is coupled to the output node of said first latch, a first terminal of the third PMOS transistor is coupled to the first terminal of the first NMOS transistor, a gate of the third NMOS transistor is coupled to the output node of said second latch, a first terminal of the third NMOS transistor is coupled to the first terminal of the second PMOS transistor, and the first terminal of the third NMOS transistor is coupled to the first terminal of the third PMOS transistor by an output node of said protection module.

11. The circuit of claim 10, wherein a second terminal of the third PMOS transistor is tied to a first voltage level, a second terminal of the third NMOS transistor is tied to a second voltage level higher than the first voltage level, and a second terminal of the first NMOS transistor and a second terminal of the first PMOS transistor are each coupled to an input node of said circuit.

12. The circuit of claim 11, wherein said input node of said circuit has a voltage varying between a reference voltage level and a third voltage level, wherein the reference voltage level is lower than the first voltage level, and the third voltage level is higher than the second voltage level.

13. The circuit of claim 11, further comprising:
  a third latch including fourth and fifth NMOS transistors, wherein a gate of the fourth NMOS transistor is coupled to a first terminal of the fifth NMOS transistor, a gate of the fifth NMOS transistor is coupled to a first terminal of the fourth NMOS transistor, and a second terminal of the fourth NMOS transistor is coupled to a second terminal of the fifth NMOS transistor by an output node of said third latch; and
  a fourth latch including fourth and fifth PMOS transistors, wherein a gate of the fourth PMOS transistor is coupled to a first terminal of the fifth PMOS transistor, a gate of the fifth PMOS transistor is coupled to a first terminal of the fourth PMOS transistor, and a second terminal of the fourth PMOS transistor is coupled to a second terminal of the fifth PMOS transistor by an output node of said fourth latch.

14. The circuit of claim 13, further comprising:
a fifth latch including sixth and seventh NMOS transistors, wherein a gate of the sixth NMOS transistor is coupled to a first terminal of the seventh NMOS transistor, a gate of the seventh NMOS transistor is coupled to a first terminal of the sixth NMOS transistor, and a second terminal of the sixth NMOS transistor is coupled to a second terminal of the seventh NMOS transistor by an output node of said fifth latch; and
a sixth latch including sixth and seventh PMOS transistors, wherein a gate of the sixth PMOS transistor is coupled to a first terminal of the seventh PMOS transistor, a gate of the seventh PMOS transistor is coupled to a first terminal of the sixth PMOS transistor, and a second terminal of the sixth PMOS transistor is coupled to a second terminal of the seventh PMOS transistor by an output node of said sixth latch;
wherein the first terminal of the seventh NMOS transistor and the first terminal of the sixth PMOS transistor are coupled to the output node of one of said third and fourth latches.

15. The circuit of claim 10, further comprising:
a third latch including fourth and fifth NMOS transistors, wherein a gate of the fourth NMOS transistor is coupled to a first terminal of the fifth NMOS transistor, a gate of the fifth NMOS transistor is coupled to a first terminal of the fourth NMOS transistor, and a second terminal of the fourth NMOS transistor is coupled to a second terminal of the fifth NMOS transistor by an output node of said third latch; and
a fourth latch including fourth and fifth PMOS transistors, wherein a gate of the fourth PMOS transistor is coupled to a first terminal of the fifth PMOS transistor, a gate of the fifth PMOS transistor is coupled to a first terminal of the fourth PMOS transistor, and a second terminal of the fourth PMOS transistor is coupled to a second terminal of the fifth PMOS transistor by an output node of said fourth latch.

16. The circuit of claim 15, wherein a second terminal of the third PMOS transistor is tied to a first voltage level, a second terminal of the third NMOS transistor is tied to a second voltage level higher than the first voltage level, and a second terminal of the first NMOS transistor and a second terminal of the first PMOS transistor are each coupled to an input node of said circuit.

17. The circuit of claim 16, wherein said input node of said circuit has a voltage varying between a reference voltage level and a third voltage level, wherein the reference voltage level is lower than the first voltage level, and the third voltage level is higher than the second voltage level.

18. The circuit of claim 15, further comprising:
a fifth latch including sixth and seventh NMOS transistors, wherein a gate of the sixth NMOS transistor is coupled to a first terminal of the seventh NMOS transistor, a gate of the seventh NMOS transistor is coupled to a first terminal of the sixth NMOS transistor, and a second terminal of the sixth NMOS transistor is coupled to a second terminal of the seventh NMOS transistor by an output node of said fifth latch; and
a sixth latch including sixth and seventh PMOS transistors, wherein a gate of the sixth PMOS transistor is coupled to a first terminal of the seventh PMOS transistor, a gate of the seventh PMOS transistor is coupled to a first terminal of the sixth PMOS transistor, and a second terminal of the sixth PMOS transistor is coupled to a second terminal of the seventh PMOS transistor by an output node of said sixth latch;
wherein the first terminal of the seventh NMOS transistor and the first terminal of the sixth PMOS transistor are coupled to the output node of one of said third and fourth latches.

19. A method comprising:
providing an input signal having a voltage varying between a first voltage level and a second voltage level, wherein the first voltage level is lower than the second voltage level;
generating a first signal having a voltage varying between the first voltage level and a third voltage level, wherein the third voltage level is higher than the first voltage level and lower than the second voltage level, and the first signal is generated based on the input signal;
generating a second signal having a voltage varying between a fourth voltage level and the second voltage level, wherein the fourth voltage level is higher than the first voltage level and lower than the third voltage level, and the second signal is generated based on the input signal; and
selectively setting a third signal to one of the third and fourth voltage levels based on the first and second signals.

20. The method of claim 19, further comprising:
based on the first signal, generating a fourth signal having a voltage varying between the first voltage level and the fourth voltage level, wherein the fourth signal is clamped at the fourth voltage level when the input signal is higher than the fourth voltage level; and
based on the second signal, generating a fifth signal having a voltage varying between the third voltage level and the second voltage level, wherein the fifth signal is clamped at the third voltage level when the input signal is lower than the third voltage level.

* * * * *